(12) United States Patent
Kimura et al.

(10) Patent No.: US 10,199,365 B2
(45) Date of Patent: Feb. 5, 2019

(54) SEMICONDUCTOR MODULE

(71) Applicant: Kabushiki Kaisha Toshiba, Minato-ku (JP)

(72) Inventors: Akiya Kimura, Yokohama (JP); Tomohiro Iguchi, Kawasaki (JP); Akihiro Sasaki, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/887,424

(22) Filed: Feb. 2, 2018

(65) Prior Publication Data

US 2018/0226389 A1 Aug. 9, 2018

(30) Foreign Application Priority Data

Feb. 9, 2017 (JP) .................... 2017-021893

(51) Int. Cl.
| | |
|---|---|
| *H01L 23/492* | (2006.01) |
| *H01L 25/18* | (2006.01) |
| *H01L 23/367* | (2006.01) |
| *H01L 23/00* | (2006.01) |
| *H01L 25/00* | (2006.01) |
| *H01L 23/485* | (2006.01) |
| *H01L 25/07* | (2006.01) |
| *H01L 23/42* | (2006.01) |

(Continued)

(52) U.S. Cl.
CPC ............ *H01L 25/18* (2013.01); *H01L 23/367* (2013.01); *H01L 23/485* (2013.01); *H01L 24/26* (2013.01); *H01L 24/33* (2013.01); *H01L 24/49* (2013.01); *H01L 25/072* (2013.01); *H01L 25/50* (2013.01); *H01L 23/42* (2013.01); *H01L 23/4821* (2013.01); *H01L 23/50* (2013.01); *H01L 24/41* (2013.01); *H01L 2924/014* (2013.01); *H01L 2924/1425* (2013.01)

(58) Field of Classification Search
CPC ..... H01L 23/4821; H01L 23/50; H01L 24/26; H01L 24/41; H01L 24/42; H01L 25/15
USPC .......................................... 257/724
See application file for complete search history.

(56) References Cited

U.S. PATENT DOCUMENTS

2002/0186545 A1* 12/2002 Fukada ................ H01L 23/473
361/719
2006/0022326 A1* 2/2006 Morita ................ H01L 23/4928
257/692

(Continued)

FOREIGN PATENT DOCUMENTS

| EP | 2 506 300 A2 | 10/2012 |
|---|---|---|
| EP | 2 722 879 A1 | 4/2014 |

(Continued)

*Primary Examiner* — George Fourson, III
(74) *Attorney, Agent, or Firm* — Oblon, McClelland, Maier & Neustadt, L.L.P.

(57) ABSTRACT

According to one embodiment, a semiconductor module includes a first circuit component, a first connection member, and a first wire. The first circuit component includes a first substrate, a first conductive layer, a first switching device, and a first diode. The first substrate has an insulation property. The first connection member is provided on a first electrode of the first switching device and the fourth electrode of the first diode, and has a conductive property. The first wire connects the first conductive layer and the first connection member.

20 Claims, 11 Drawing Sheets

(51) Int. Cl.
*H01L 23/50* (2006.01)
*H01L 23/482* (2006.01)

(56) References Cited

U.S. PATENT DOCUMENTS

| | | | | |
|---|---|---|---|---|
| 2010/0127383 | A1* | 5/2010 | Oka | H01L 24/40 |
| | | | | 257/692 |
| 2012/0241953 | A1* | 9/2012 | Yamada | H01L 23/4334 |
| | | | | 257/737 |
| 2012/0248564 | A1 | 10/2012 | Hauenstein | |
| 2013/0009298 | A1* | 1/2013 | Ota | H01L 23/24 |
| | | | | 257/676 |
| 2013/0286617 | A1* | 10/2013 | Shibasaki | H01L 23/049 |
| | | | | 361/772 |
| 2014/0061673 | A1 | 3/2014 | Miyanagi | |
| 2015/0179551 | A1* | 6/2015 | Nakamura | H01L 25/072 |
| | | | | 257/773 |
| 2015/0255444 | A1* | 9/2015 | Sato | H01L 21/67121 |
| | | | | 257/677 |
| 2015/0270201 | A1* | 9/2015 | Kim | H01L 23/49568 |
| | | | | 257/676 |
| 2016/0141214 | A1 | 5/2016 | Sato | |
| 2016/0294379 | A1 | 10/2016 | Hayashiguchi et al. | |
| 2016/0365307 | A1* | 12/2016 | Miyakoshi | H01L 23/49811 |
| 2017/0064808 | A1* | 3/2017 | Rizza | H01L 23/24 |
| 2017/0092596 | A1 | 3/2017 | Yoshihara | |
| 2017/0154834 | A1* | 6/2017 | Tonedachi | H01L 25/115 |
| 2017/0338190 | A1* | 11/2017 | Fujino | H01L 23/051 |
| 2017/0365536 | A1* | 12/2017 | Amo | H05K 7/20927 |
| 2018/0138152 | A1* | 5/2018 | Jong | H01L 23/3735 |
| 2018/0197838 | A1* | 7/2018 | Besshi | H01L 25/07 |

FOREIGN PATENT DOCUMENTS

| | | |
|---|---|---|
| JP | 2005-116702 | 4/2005 |
| JP | 2007-234690 A | 9/2007 |
| JP | 4085563 | 5/2008 |
| JP | 2009-177038 | 8/2009 |
| JP | 2012-74730 | 4/2012 |
| JP | 2013-8749 | 1/2013 |
| JP | 2016-4796 A | 1/2016 |
| JP | 2016-99127 A | 5/2016 |

* cited by examiner

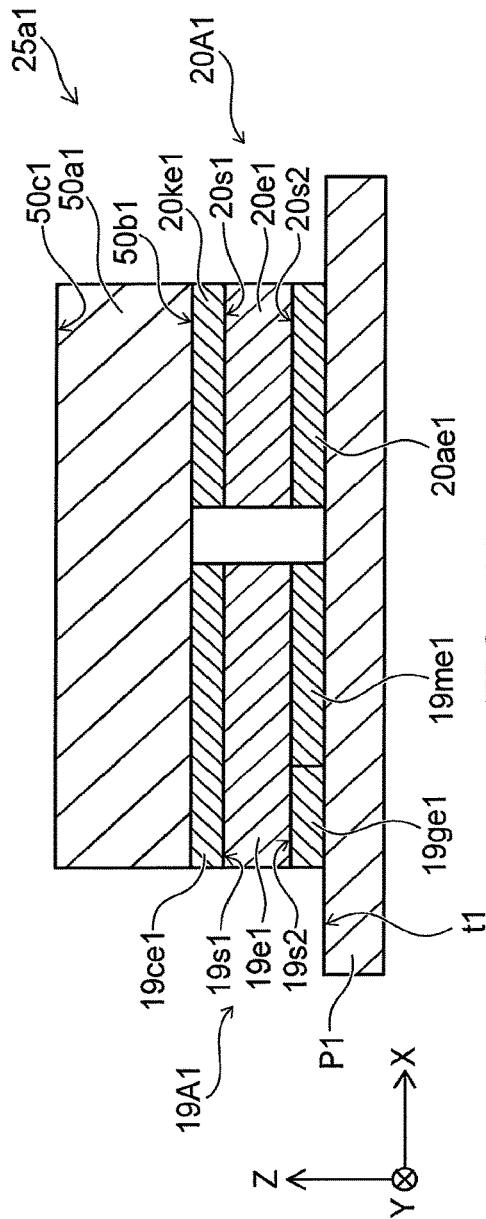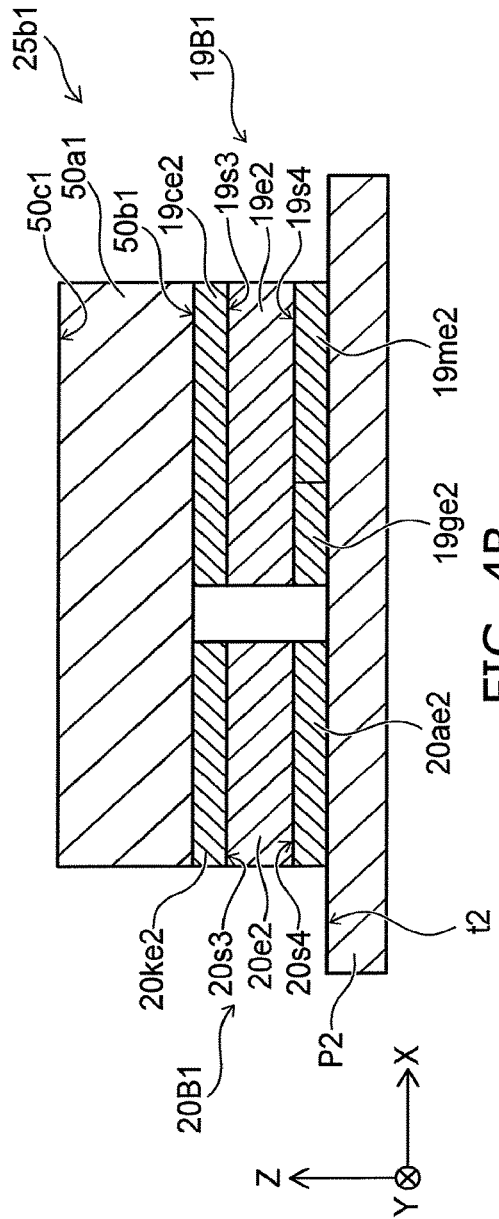
FIG. 4A
FIG. 4B

SEMICONDUCTOR MODULE

CROSS-REFERENCE TO RELATED APPLICATIONS

This application is based upon and claims the benefit of priority from Japanese Patent Application No. 2017-021893, filed on Feb. 9, 2017; the entire contents of which are incorporated herein by reference.

FIELD

Embodiments of the invention generally relate to a semiconductor module.

BACKGROUND

Semiconductor modules such as inverter devices for various applications have been continually miniaturized and expected to improve the flexibility of layout in a device. Furthermore, in such semiconductor modules, higher reliability is desired in conjunction with high productivity.

BRIEF DESCRIPTION OF THE DRAWINGS

FIGS. 4A and 4B are sectional views taken along line A1-A2 and line B1-B2 of FIG. 3;

DETAILED DESCRIPTION

Figure 1:
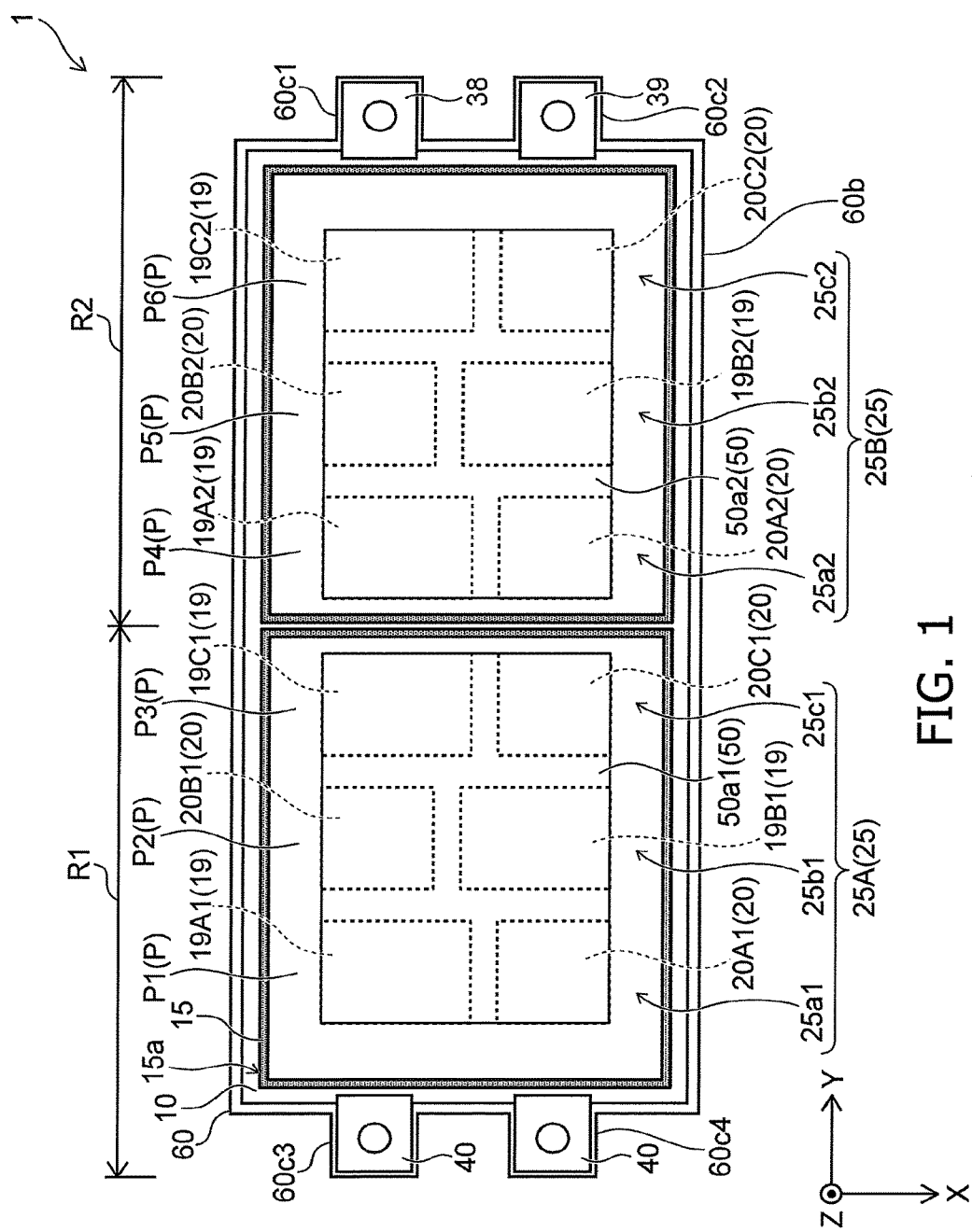
FIG. 1 is a plan view showing a semiconductor module according to a first embodiment.

According to one embodiment, a semiconductor module includes a first circuit component, a first connection member, and a first wire. The first circuit component includes a first substrate, a first conductive layer, a first switching device, and a first diode. The first substrate has an insulation property. The first conductive layer is provided on the first substrate. The first switching device is provided on the first conductive layer and includes a first element part, a first electrode provided on an upper surface of the first element part, and a second electrode and a third electrode provided on a lower surface of the first element part. The first diode is provided on the first conductive layer, spaced from the first switching device in a first direction parallel to an upper surface of the first substrate, and includes a second element part, a fourth electrode provided on an upper surface of the second element part, and a fifth electrode provided on a lower surface of the second element part. The first connection member is provided on the first electrode and the fourth electrode, and has a conductive property. The first wire connects the first conductive layer and the first connection member.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the specification, "provided on" includes the case of being provided to contact directly and further includes the case of being provided with another component inserted therebetween. "Being provided to oppose" includes the case of being provided to contact directly above or below and further includes the case of being provided with another component inserted therebetween.

First Embodiment

FIG. 1 is a plan view showing a semiconductor module according to a first embodiment.

Figure 2:
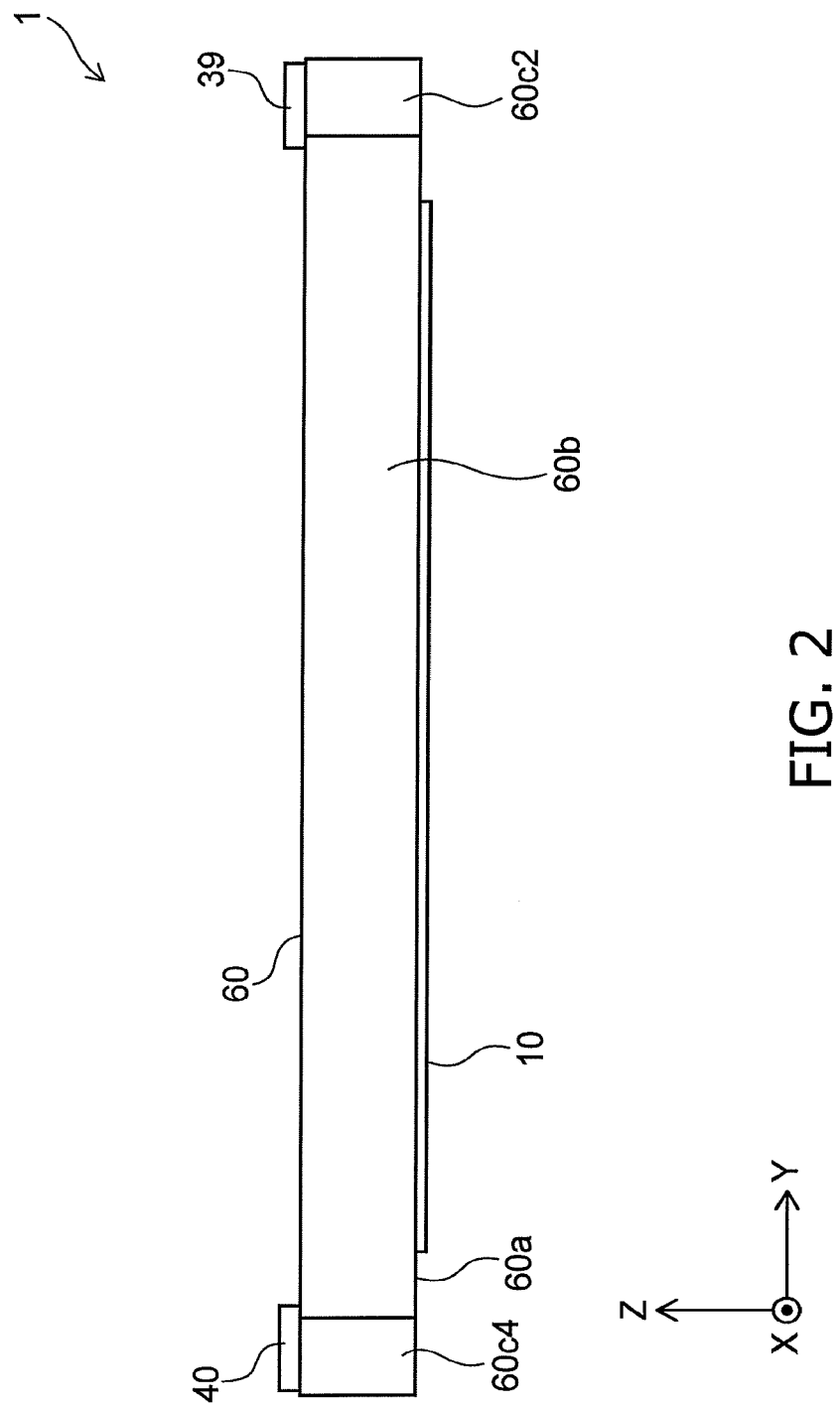
FIG. 2 is a side view showing the semiconductor module according to the first embodiment.

FIG. 2 is a side view showing the semiconductor module according to the first embodiment.

FIGS. 1 and 2 show the top surface and a side surface of the semiconductor module 1, respectively.

As shown in FIG. 1, the semiconductor module 1 is provided with a heat dissipation plate 10, a mounting substrate 25, a connection member 50, a positive terminal 38, a negative terminal 39, an output terminal 40, and a casing 60.

In this specification, an XYZ orthogonal coordinate system is hereinafter used for convenience of description. The direction from the heat dissipation plate 10 to the mounting substrate 25 is referred to as "Z-direction". One direction orthogonal to the Z-direction is referred to as "X-direction". The direction orthogonal to the Z-direction and the X-direction is referred to as "Y-direction".

The heat dissipation plate 10 contains e.g. copper (Cu). The heat dissipation plate 10 is shaped like e.g. a rectangle and functions as a base.

The mounting substrate 25 is provided as a circuit component on the heat dissipation plate 10. The mounting substrate 25 is bonded onto the heat dissipation plate 10 via e.g. a solder layer. For instance, a plurality of mounting substrates 25 are placed along a long edge of the rectangular heat dissipation plate 10.

The mounting substrate 25 is configured as follows. A circuit pattern P (conductive layer) containing e.g. copper is bonded to the upper surface and the lower surface of an insulating substrate 15 made of e.g. ceramic. A switching device 19 and a diode 20 are placed on the circuit pattern P on the upper surface of the substrate 15. For instance, the semiconductor module 1 may be an inverter device. In this case, the switching device 19 can be an IGBT (insulated gate bipolar transistor), and the diode 20 can be a flyback diode. As shown in FIG. 1, the X-direction and the Y-direction correspond to directions parallel to the upper surface 15a of the substrate 15.

In the example of FIG. 1, the semiconductor module 1 is provided with six mounting components 25a1, 25a2, 25b1, 25b2, 25c1, 25c2. Three mounting components 25a1, 25b1, 25c1 are placed in the region R1 of the semiconductor module 1 and constitute a mounting substrate 25A. Three mounting components 25a2, 25b2, 25c2 are placed in the region R2 of the semiconductor module 1 and constitute a mounting substrate 25B. The region R1 and the region R2 are regions adjacent to each other in the Y-direction.

The mounting components 25a1, 25b1, 25c1 in the region R1 are provided with switching devices 19A1, 19B1, 19C1, respectively. The mounting components 25a1, 25b1, 25c1 are provided with diodes 20A1, 20B1, 20C1, respectively.

The switching device 19A1 and the diode 20A1 are placed on the circuit pattern P1. The switching device 19B1 and the diode 20B1 are placed on the circuit pattern P2. The switching device 19C1 and the diode 20C1 are placed on the circuit pattern P3.

The switching device 19A1 and the diode 20A1, the switching device 19B1 and the diode 20B1, and the switching device 19C1 and the diode 20C1 are connected in parallel through a connection member 50 (connection member 50a1) to form the positive electrode side of the inverter circuit.

The mounting components 25a2, 25b2, 25c2 in the region R2 are provided with switching devices 19A2, 19B2, 19C2, respectively. The mounting components 25a2, 25b2, 25c2 are provided with diodes 20A2, 20B2, 20C2, respectively.

The switching device 19A2 and the diode 20A2 are placed on the circuit pattern P4. The switching device 19B2 and the diode 20B2 are placed on the circuit pattern P5. The switching device 19C2 and the diode 20C2 are placed on the circuit pattern P6.

The switching device 19A2 and the diode 20A2, the switching device 19B2 and the diode 20B2, and the switching device 19C2 and the diode 20C2 are connected in parallel through a connection member 50 (connection member 50a2) to form the negative electrode side of the inverter circuit.

The connection member 50 contains a conductive material. The connection member 50 contains e.g. copper (Cu). The connection member 50 may contain aluminum (Al) or nickel (Ni). The connection member 50 is shaped like e.g. a rectangle and provided on the mounting substrate 25.

In the example of FIG. 1, the semiconductor module 1 is provided with two connection members 50a1, 50a2. The connection member 50a1 is located on the mounting substrate 25A. The connection member 50a2 is located on the mounting substrate 25B. The connection member 50a1 and the connection member 50a2 are located in the region R1 and the region R2 of the semiconductor module 1, respectively.

The positive terminal 38 and the negative terminal 39 are formed from e.g. a metal plate, or formed by metal-plating the surface of an insulator. A current flows from the positive terminal 38 to the negative terminal 39 through the mounting substrate 25. Thus, the mounting substrate 25 is supplied with electric power.

The output terminal 40 is formed from e.g. a metal plate, or formed by metal-plating the surface of an insulator. A current flows to one end of the output terminal 40 through the mounting substrate 25. The other end of the output terminal 40 is connected to e.g. a load such as a coil.

As shown in FIGS. 1 and 2, the casing 60 is formed from e.g. resin. The casing 60 includes a frame-shaped bottom surface 60a, a sidewall 60b provided at the periphery of the bottom surface 60a, and four support parts 60c1, 60c2, 60c3, 60c4 protruding outside in the direction along the long edge from the short edge side of the sidewall 60b.

The casing 60 is fixedly bonded to the periphery of the heat dissipation plate 10 via the bottom surface 60a. An opening is formed from the sidewall 60b and the heat dissipation plate 10. The mounting substrate 25 and the connection member 50 are located in the opening of the casing 60.

The positive terminal 38 is held on the support part 60c1. The negative terminal 39 is held on the support part 60c2. The output terminal 40 is held on the support parts 60c3, 60c4.

Figure 3:
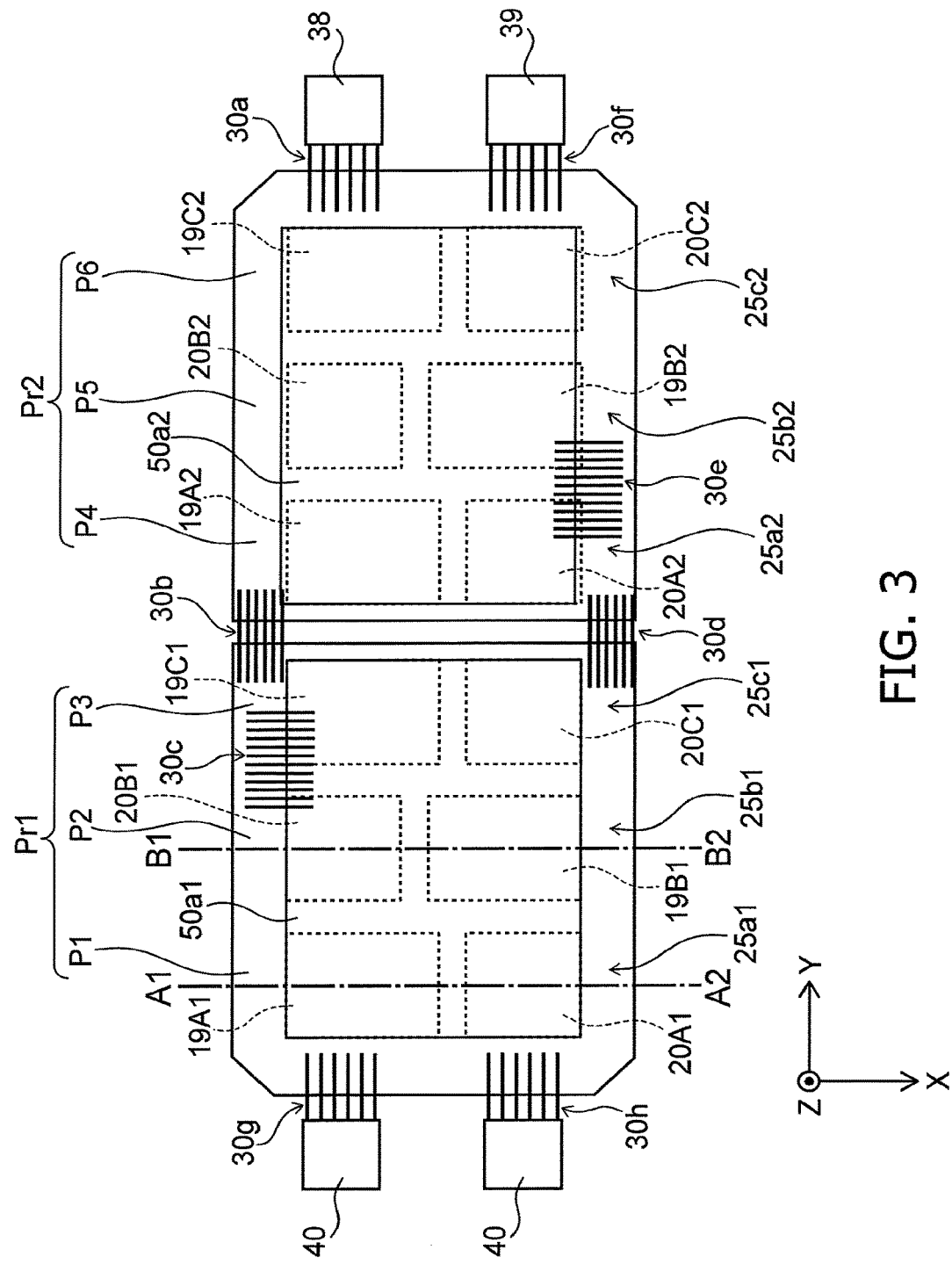
FIG. 3 is a plan view showing a part of the semiconductor module according to the first embodiment.

FIG. 3 is a plan view showing part of the semiconductor module according to the first embodiment.

FIGS. 4A and 4B are sectional views taken along line A1-A2 and line B1-B2 of FIG. 3.

Figure 5A:
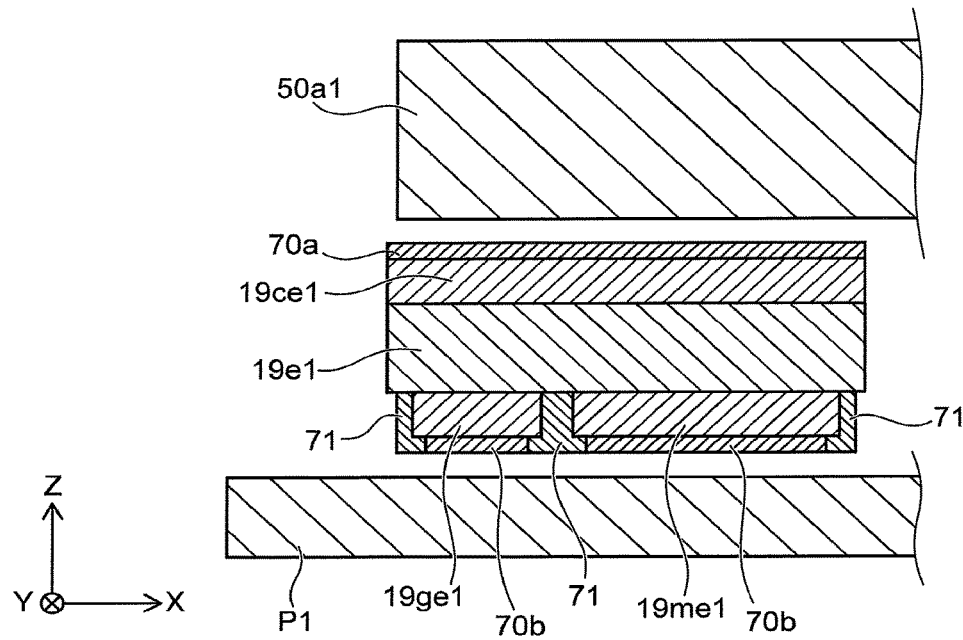
FIGS. 5A and 5B are partial enlarged views of FIG. 4A.
Figure 5B:
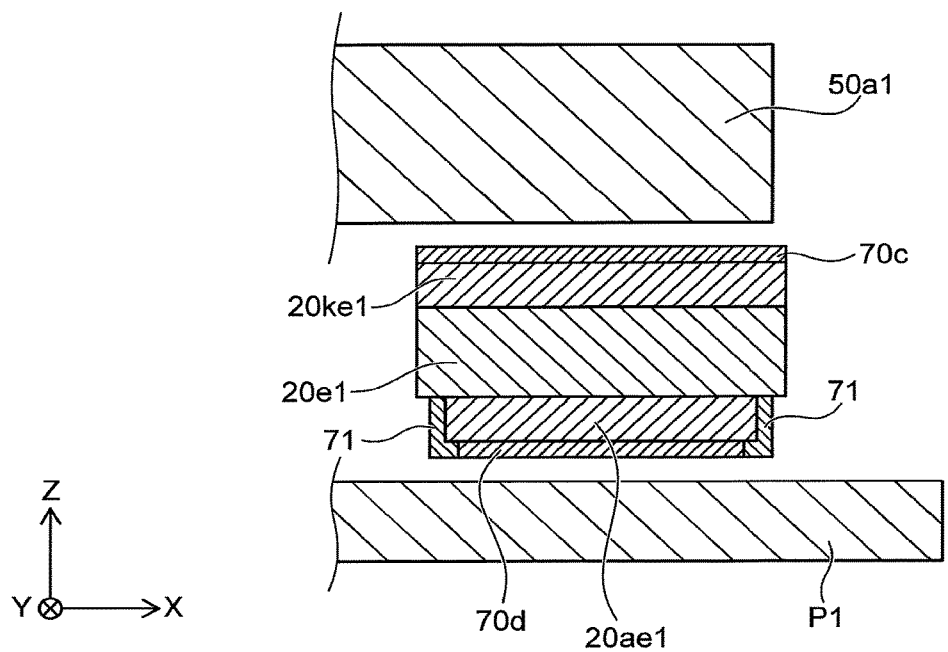

FIGS. 5A and 5B are partial enlarged views of FIG. 4A.

Figure 6A:
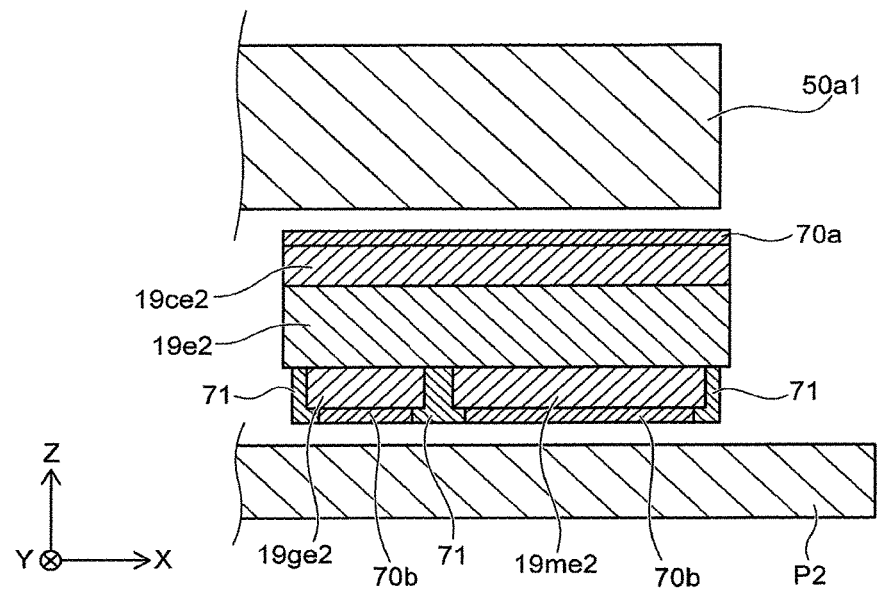
FIGS. 6A and 6B are partial enlarged views of FIG. 4B.
Figure 6B:
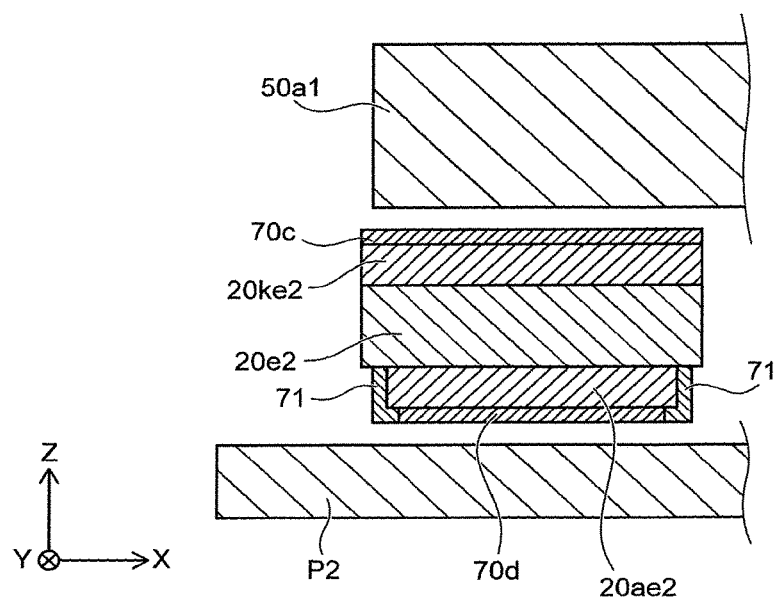

FIGS. 6A and 6B are partial enlarged views of FIG. 4B.

Figure 7:
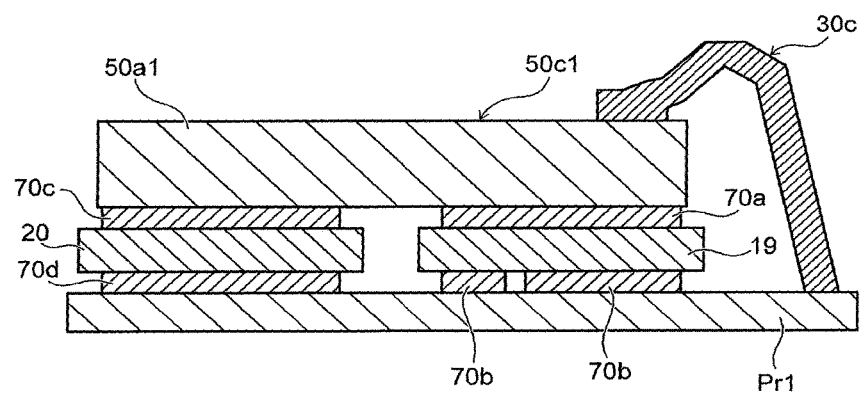
FIG. 7 is a partial enlarged sectional view of FIG. 3.

FIG. 7 is a partial enlarged sectional view of FIG. 3.

FIG. 3 shows the XY plane of the mounting substrate 25 and the connection member 50 in the semiconductor module 1. FIGS. 4A and 4B, FIGS. 5A and 5B, and FIGS. 6A and 6B show XZ cross sections of the mounting substrate 25 and the connection member 50 in the semiconductor module 1. FIG. 7 shows the XZ cross section of the configuration in which the wire 30c is connected to the connection member 50a.

As shown in FIG. 3, in the mounting components 25a1, 25b1, 25c1, the switching devices 19A1, 19B1, 19C1 and the diodes 20A1, 20B1, 20C1 are mounted on the circuit patterns P1, P2, P3, respectively.

The connection member 50a1 is provided on the switching devices 19A1, 19B1, 19C1 and the diodes 20A1, 20B1, 20C1. For instance, the connection member 50a1 covers the upper surface electrode of the switching devices 19A1, 19B1, 19C1 and the upper surface electrode of the diodes 20A1, 20B1, 20C1.

In the mounting components 25a2, 25b2, 25c2, the switching devices 19A2, 19B2, 19C2 and the diodes 20A2, 20B2, 20C2 are mounted on the circuit patterns P4, P5, P6, respectively.

The connection member 50a2 is provided on the switching devices 19A2, 19B2, 19C2 and the diodes 20A2, 20B2, 20C2. For instance, the connection member 50a2 covers the upper surface electrode of the switching devices 19A2, 19B2, 19C2 and the upper surface electrode of the diodes 20A2, 20B2, 20C2.

In the following, the mounting component 25a1 is described.

As shown in FIG. 4A, the switching device 19A1 of the mounting component 25a1 includes an element part 19e1, an upper surface electrode 19ce1, a lower surface electrode 19me1, and a control electrode 19ge1. The element part 19e1 has an upper surface 19s1 and a lower surface 19s2. The element part 19e1 is shaped like e.g. a rectangle.

The upper surface electrode 19ce1 is provided on the upper surface 19s1 of the element part 19e1. The upper surface electrode 19ce1 is opposed to the lower surface 50b1 of the connection member 50a1 and electrically connected to the connection member 50a1. The upper surface electrode 19ce1 is e.g. a collector electrode.

The lower surface electrode 19me1 is provided on the lower surface 19s2 of the element part 19e1. The lower surface electrode 19me1 is opposed to the upper surface t1 of the circuit pattern P1 and electrically connected to the circuit pattern P1. The lower surface electrode 19me1 is e.g. an emitter electrode.

The control electrode 19ge1 is provided on the lower surface 19s2 of the element part 19e1. The control electrode 19ge1 is opposed to the upper surface t1 of the circuit pattern P1 and electrically connected to the circuit pattern P1. The control electrode 19ge1 is e.g. a gate electrode.

As shown in FIG. 5A, the connection member 50a1 is bonded onto the upper surface electrode 19ce1 via e.g. a solder layer 70a. The lower surface electrode 19me1 and the control electrode 19ge1 are bonded onto the circuit pattern P1 via e.g. a solder layer 70b.

The solder layers 70a, 70b are layers formed from e.g. lead-free solder composed primarily of tin. The solder layer 70a is formed on the upper surface of the upper surface electrode 19ce1. The solder layer 70b is formed on the lower surface of the lower surface electrode 19me1 and the lower surface of the control electrode 19ge1. Thus, the upper surface electrode 19ce1 is electrically connected to the connection member 50a1. The lower surface electrode 19me1 and the control electrode 19ge1 are electrically connected to the circuit pattern P1 on the substrate 15. A protective layer 71 is formed in an L-shape so as to cover both ends of the lower surface electrode 19me1 and both ends of the control electrode 19ge1.

As shown in FIG. 4A, the diode 20A1 of the mounting component 25a1 includes an element part 20e1, an upper surface electrode 20ke1, and a lower surface electrode 20ae1. The element part 20e1 has an upper surface 20s1 and a lower surface 20s2. The element part 20e1 is shaped like e.g. a rectangle.

The upper surface electrode 20ke1 is provided on the upper surface 20s1 of the element part 20e1. The upper surface electrode 20ke1 is opposed to the lower surface 50b1 of the connection member 50a1 and electrically connected to the connection member 50a1. The upper surface electrode 20ke1 is e.g. a cathode electrode.

The lower surface electrode 20ae1 is provided on the lower surface 20s2 of the element part 20e1. The lower surface electrode 20ae1 is opposed to the upper surface t1 of the circuit pattern P1 and electrically connected to the circuit pattern P1. The lower surface electrode 20ae1 is e.g. an anode electrode.

As shown in FIG. 5B, the connection member 50a1 is bonded onto the upper surface electrode 20ke1 via e.g. a solder layer 70c. The lower surface electrode 20ae1 is bonded onto the circuit pattern P1 via e.g. a solder layer 70d.

The solder layers 70c, 70d are layers formed from e.g. lead-free solder composed primarily of tin. The solder layer 70c is formed on the upper surface of the upper surface electrode 20ke1. The solder layer 70d is formed on the lower surface of the lower surface electrode 20ae1. Thus, the upper surface electrode 20ke1 is electrically connected to the connection member 50a1. The lower surface electrode 20ae1 is electrically connected to the circuit pattern P1 on the substrate 15. A protective layer 71 is formed in an L-shape so as to cover both ends of the lower surface electrode 20ae1.

Bonding between the constituents of the mounting component 25a1 and bonding between the mounting component 25a1 and the connection member 50a1 have been described above. This also similarly applies to bonding between the constituents of the mounting component 25c1 and bonding between the mounting component 25c1 and the connection member 50a1.

Bonding between the constituents of the mounting component 25a2 and bonding between the mounting component 25a2 and the connection member 50a2 are also similar to the bonding between the constituents of the mounting component 25a1 and the bonding between the mounting component 25a1 and the connection member 50a1. This also similarly applies to bonding between the constituents of the mounting component 25c2 and bonding between the mounting component 25c2 and the connection member 50a2.

In the following, the mounting component 25b1 is described.

As shown in FIG. 4B, the switching device 19B1 of the mounting component 25b1 includes an element part 19e2, an upper surface electrode 19ce2, a lower surface electrode 19me2, and a control electrode 19ge2. The element part 19e2 has an upper surface 19s3 and a lower surface 19s4. The element part 19e2 is shaped like e.g. a rectangle.

The upper surface electrode 19ce2 is provided on the upper surface 19s3 of the element part 19e2. The upper surface electrode 19ce2 is opposed to the lower surface 50b1 of the connection member 50a1 and electrically connected to the connection member 50a1. The upper surface electrode 19ce2 is e.g. a collector electrode.

The lower surface electrode 19me2 is provided on the lower surface 19s4 of the element part 19e2. The lower surface electrode 19me2 is opposed to the upper surface t2 of the circuit pattern P2 and electrically connected to the circuit pattern P2. The lower surface electrode 19me2 is e.g. an emitter electrode.

The control electrode 19ge2 is provided on the lower surface 19s4 of the element part 19e2. The control electrode 19ge2 is opposed to the upper surface t2 of the circuit pattern P2 and electrically connected to the circuit pattern P2. The control electrode 19ge2 is e.g. a gate electrode.

As shown in FIG. 6A, the connection member 50a1 is bonded onto the upper surface electrode 19ce2 via e.g. a solder layer 70a. The lower surface electrode 19me2 and the control electrode 19ge2 are bonded onto the circuit pattern P2 via e.g. a solder layer 70b. The solder layer 70a is formed on the upper surface of the upper surface electrode 19ce2. The solder layer 70b is formed on the lower surface of the lower surface electrode 19me2 and the lower surface of the control electrode 19ge2. Thus, the upper surface electrode 19ce2 is electrically connected to the connection member 50a1. The lower surface electrode 19me2 and the control electrode 19ge2 are electrically connected to the circuit pattern P2 on the substrate 15. A protective layer 71 is formed in an L-shape so as to cover both ends of the lower surface electrode 19me2 and both ends of the control electrode 19ge2.

As shown in FIG. 4B, the diode 20B1 of the mounting component 25b1 includes an element part 20e2, an upper surface electrode 20ke2, and a lower surface electrode 20ae2. The element part 20e2 has an upper surface 20s3 and a lower surface 20s4. The element part 20e2 is shaped like e.g. a rectangle.

The upper surface electrode 20ke2 is provided on the upper surface 20s3 of the element part 20e2. The upper surface electrode 20ke2 is opposed to the lower surface 50b1 of the connection member 50a1 and electrically connected to the connection member 50a1. The upper surface electrode 20ke2 is e.g. a cathode electrode.

The lower surface electrode 20ae2 is provided on the lower surface 20s4 of the element part 20e2. The lower surface electrode 20ae2 is opposed to the upper surface t2 of the circuit pattern P2 and electrically connected to the circuit pattern P2. The lower surface electrode 20ae2 is e.g. an anode electrode.

As shown in FIG. 6B, the connection member 50a1 is bonded onto the upper surface electrode 20ke2 via e.g. a solder layer 70c. The lower surface electrode 20ae2 is bonded onto the circuit pattern P2 via e.g. a solder layer 70d. The solder layer 70c is formed on the upper surface of the upper surface electrode 20ke2. The solder layer 70d is formed on the lower surface of the lower surface electrode 20ae2. Thus, the upper surface electrode 20ke2 is electrically connected to the connection member 50a1. The lower surface electrode 20ae2 is electrically connected to the circuit pattern P2 on the substrate 15. A protective layer 71 is formed in an L-shape so as to cover both ends of the lower surface electrode 20ae2.

Bonding between the constituents of the mounting component 25b1 and bonding between the mounting component 25b1 and the connection member 50a1 have been described above. This also similarly applies to bonding between the constituents of the mounting component 25b2 and bonding between the mounting component 25b2 and the connection member 50a2.

In the following, connection of the mounting components 25a1, 25a2, 25b1, 25b2, 25c1, 25c2 with the positive terminal 38, the negative terminal 39, and the output terminal 40 is described.

As shown in FIG. 3, the semiconductor module 1 is provided with wires 30a-30f. The wires 30a-30f are formed from a conductor such as metal. The wires 30a-30f are e.g. bonding wires for interconnection. Each of the wires 30a-30f is composed of an arbitrary number of bonding wires.

Circuit patterns Pr1, Pr2 are provided on the substrate 15. The circuit pattern Pr1 includes the circuit patterns P1, P2, P3 in the mounting components 25a1, 25b1, 25c1. The circuit pattern Pr2 includes the circuit patterns P4, P5, P6 in the mounting components 25a2, 25b2, 25c2.

The wire 30a connects the positive terminal 38 to the circuit pattern Pr2.

The wires 30b, 30d connect the circuit pattern Pr1 to the circuit pattern Pr2.

The wire 30c connects the connection member 50a1 to the circuit pattern Pr1.

The wire 30e connects the connection member 50a2 to the circuit pattern Pr2.

The wire 30f connects the negative terminal 39 to the circuit pattern Pr2.

As shown in FIGS. 3 and 7, one end of the wire 30c is connected to the upper surface (50c1) of the connection member 50a1. The other end of the wire 30c is connected to the circuit pattern Pr1 (P2, P3). As shown in FIG. 3, one end of the wire 30e is connected to the upper surface of the connection member 50a2. The other end of the wire 30e is connected to the circuit pattern Pr2 (P4, P5).

The connection point of the wire 30c with the connection member 50a1 and the circuit pattern Pr1 is arbitrary. The connection point of the wire 30e with the connection member 50a2 and the circuit pattern Pr2 is arbitrary.

Connection of the wires 30a-30f allows a current to flow in the semiconductor module 1. That is, the current flows from the positive terminal 38 to the circuit pattern Pr2 through the wire 30a, and flows from the circuit pattern Pr2 to the circuit pattern Pr1 through the wire 30b. Then, the current flows from the circuit pattern Pr1 to the connection member 50a1 through the wire 30c.

The connection member 50a1 is electrically connected to the upper surface electrode 19ce1 of the switching device 19A1 of the mounting component 25a1, the upper surface electrode 19ce2 of the switching device 19B1 of the mounting component 25b1, and the upper surface electrode 19ce3 of the switching device 19C1 of the mounting component 25c1. Thus, the current flows from the connection member 50a1 to the upper surface electrodes 19ce1-19ce3. Then, the current flows to the lower surface electrode 19me1 of the switching device 19A1, the lower surface electrode 19me2 of the switching device 19B1, and the lower surface electrode 19me3 of the switching device 19C1.

Here, the current flows from the upper surface electrodes 19ce1-19ce3 toward the lower surface electrodes 19me1-19me3, respectively. On the other hand, the diodes 20A1, 20B1, 20C1 may be flyback diodes. In this case, for instance, when the switching devices 19A1, 19B1, 19C1 are turned off, the current flows in the diodes 20A1, 20B1, 20C1. That is, the current flows from the lower surface electrode 20ae1 of the diode 20A1 of the mounting component 25a1 to the upper surface electrode 20ke1. The current flows from the lower surface electrode 20ae2 of the diode 20B1 of the mounting component 25b1 to the upper surface electrode 20ke2. The current flows from the lower surface electrode 20ae3 of the diode 20C1 of the mounting component 25c1 to the upper surface electrode 20ke3.

The lower surface electrodes 19me1-19me3 are electrically connected to the circuit patterns P1-P3, respectively. Thus, the current flows from the circuit pattern Pr1 to the circuit pattern Pr2 through the wire 30d. Then, the current flows from the circuit pattern Pr2 to the connection member 50a2 through the wire 30e.

The connection member 50a2 is electrically connected to the upper surface electrode 19ce4 of the switching device 19A2 of the mounting component 25a2, the upper surface electrode 19ce5 of the switching device 19B2 of the mounting component 25b2, and the upper surface electrode 19ce6 of the switching device 19C2 of the mounting component 25c2. Thus, the current flows from the connection member 50a2 to the upper surface electrodes 19ce4-19ce6. Then, the current flows to the lower surface electrode 19me4 of the switching device 19A2, the lower surface electrode 19me5 of the switching device 19B2, and the lower surface electrode 19me6 of the switching device 19C2.

Here, the current flows from the upper surface electrodes 19ce4-19ce6 toward the lower surface electrodes 19me4-19me6, respectively. On the other hand, the diodes 20A2, 20B2, 20C2 may be flyback diodes. In this case, for instance, when the switching devices 19A2, 19B2, 19C2 are turned off, the current flows in the diodes 20A2, 20B2, 20C2. That is, the current flows from the lower surface electrode 20ae4 of the diode 20A2 of the mounting component 25a2 to the upper surface electrode 20ke4. The current flows from the lower surface electrode 20ae5 of the diode 20B2 of the mounting component 25b2 to the upper surface electrode 20ke5. The current flows from the lower surface electrode 20ae6 of the diode 20C2 of the mounting component 25c2 to the upper surface electrode 20ke6.

The lower surface electrodes 19me4-19me6 are electrically connected to the circuit patterns P4-P6, respectively. Thus, the current flows from the circuit pattern Pr2 to the negative terminal 39 through the wire 30f.

Accordingly, the current flows from the positive terminal to the negative terminal 39. Thus, the mounting components 25a1, 25a2, 25b1, 25b2, 25c1, 25c2 are supplied with electric power.

As shown in FIG. 3, the semiconductor module 1 is further provided with wires 30g, 30h. The wires 30g, 30h are formed from a conductor such as metal. The wires 30g, 30h are e.g. bonding wires for interconnection.

The wires 30g, 30h connect a pair of output terminals 40 to the circuit pattern Pr1. Thus, a current flows from the circuit pattern Pr1 to the output terminals 40.

In the following, a method for manufacturing the semiconductor module 1 is described.

Figure 8:
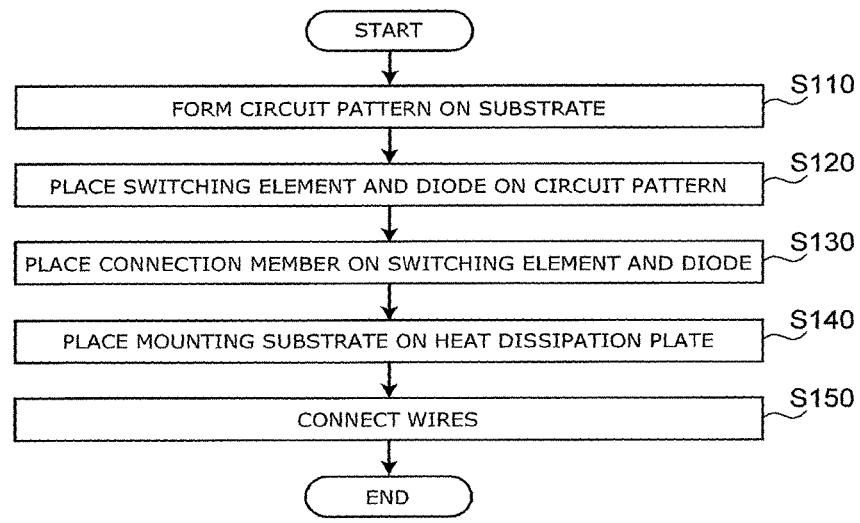
FIG. 8 is a flow chart showing a method for manufacturing the semiconductor module according to the first embodiment.

FIG. 8 is a flow chart showing a method for manufacturing the semiconductor module according to the embodiment.

As shown in FIG. 8, in assembling the semiconductor module 1, a circuit pattern P is formed on the upper surface and the lower surface of an insulating substrate 15 (S110).

Next, the lower surface electrode 19*me* and the control electrode 19*ge* of a switching device 19 and the lower surface electrode 20*ae* of a diode 20 are placed on the circuit pattern P formed on the upper surface 15*a* of the substrate 15 (S120). For instance, the lower surface electrode 19*me* and the control electrode 19*ge*, and the lower surface electrode 20*ae* are bonded onto the circuit pattern P via a solder layer 70. For instance, the lower surface electrode 19*me* is an emitter electrode, and the control electrode 19*ge* is a gate electrode. For instance, the lower surface electrode 20*ae* is an anode electrode.

Next, a connection member 50 is positioned on the upper surface electrode 19*ce* of the switching device 19 and on the upper surface electrode 20*ke* of the diode 20 (S130). For instance, the connection member 50 is bonded onto the upper surface electrode 19*ce* and the upper surface electrode 20*ke* via a solder layer 70. For instance, a rectangular connection member 50 is located on a mounting substrate 25 and covers the upper surface electrode 19*ce* and the upper surface electrode 20*ke*. For instance, the upper surface electrode 19*ce* is a collector electrode, and the upper surface electrode 20*ke* is a cathode electrode.

Next, the mounting substrate 25 provided with the connection member 50 on its upper surface is positioned on a heat dissipation plate 10 (S140). The mounting substrate 25 is bonded onto the heat dissipation plate 10 via a solder layer. In S120, S130, and S140, soldering is performed for each time a particular element is placed. However, soldering may be performed at once after all the elements are placed. Subsequently, a casing 60 and the heat dissipation plate 10 are fixedly boded.

Next, each element is connected by a wire 30 (S150). Wires 30 are used to electrically connect the circuit pattern P with the connection member 50, the circuit pattern P with the positive terminal 38, the circuit pattern P with the negative terminal 39, and the circuit pattern P with the output terminal 40. Then, the casing 60 is filled with an insulating resin, not shown. Furthermore, the opening of the casing 60 is closed with a lid, not shown.

Thus, the semiconductor module 1 is manufactured.

Next, the effect of this embodiment is described.

In a semiconductor module such as an inverter device, a circuit pattern on an insulating substrate is connected to an electrode in a chip formed from e.g. silicon through a wire formed from e.g. aluminum. For instance, in a switching device, the emitter electrode and the gate electrode are provided on the upper surface of the element part. In a diode, the anode electrode is provided on the upper surface of the element part. These electrodes are connected to the circuit pattern on the insulating substrate through wires. In such a structure of the semiconductor module, the number of wires connecting the elements increases with the increase of the current capacity of the chip. This lowers the productivity of the semiconductor module.

In the connection between the wire and the chip, a stress (also referred to as thermal stress) is likely to occur in the wire due to the difference between the linear expansion coefficient of aluminum (e.g. $23.6 \times 10^{-6}/°$ C.) and the linear expansion coefficient of silicon (e.g. $3.5 \times 10^{-6}/°$ C.). This is due to the occurrence of stress in the wire because the wire formed from a material having a larger linear expansion coefficient extends more greatly than the chip formed from a material having a smaller linear expansion coefficient. For instance, a stress occurs in the wire in the direction parallel to the upper surface of the insulating substrate. The occurrence of stress in the wire causes warpage and cracking in the wire, or makes the wire prone to detachment from the chip. Thus, with the increase of the number of wires, the number of wires undergoing cracking or detached from the chip also increases. This lowers the reliability of the semiconductor module.

The increase of the number of wires is also likely to restrict the layout in the device such as the arrangement of wires in the structure of the semiconductor module.

In the semiconductor module 1 of this embodiment, the lower surface electrode 19*me* and the control electrode 19*ge* of each switching device 19 are connected to the circuit pattern P on the substrate 15 by a solder layer 70. The upper surface electrode 19*ce* of each switching device is connected to the connection member 50 by a solder layer 70. The lower surface electrode 20*ae* of each diode 20 is connected to the circuit pattern P on the substrate 15 by a solder layer 70. The upper surface electrode 20*ke*1 of each diode 20 is connected to the connection member 50 by a solder layer 70. Furthermore, the connection member 50 is connected to the circuit pattern P by a wire 30.

Such a structure of the semiconductor module 1 can reduce the number of wires connecting between the elements. That is, compared with the structure in which the emitter electrode and the gate electrode of the switching device and the anode electrode of the diode are connected to the circuit pattern on the insulating substrate by wires, the structure of the semiconductor module 1 of this embodiment can reduce the number of wires used for connection between these electrodes and the circuit pattern P on the substrate 15. This can reduce the number of wires and improve the productivity of the semiconductor module 1.

Cracking and detachment of wires due to the occurrence of thermal stress are suppressed in the connecting portion between the wire and the chip. This can improve the reliability of the semiconductor module 1. Furthermore, reduction of the number of wires releases the space occupied by the wires and increases the flexibility of layout in the device.

This embodiment provides a semiconductor module having high productivity and high reliability.

Second Embodiment

Figure 9:
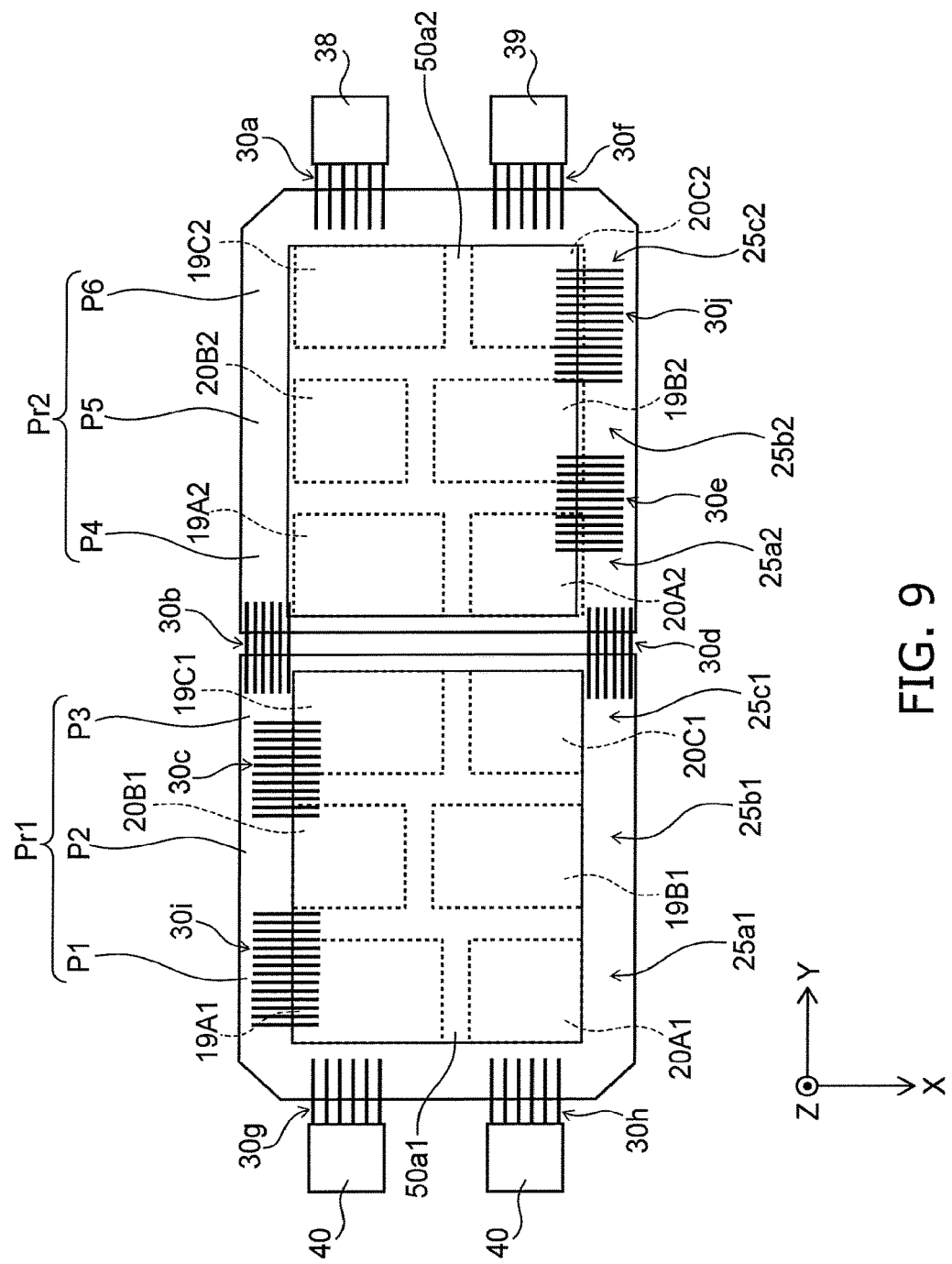
FIG. 9 is a plan view showing a part of a semiconductor module according to a second embodiment.

FIG. 9 is a plan view showing part of a semiconductor module according to a second embodiment.

FIG. 9 shows the XY plane of the mounting substrate 25 and the connection member 50 in the semiconductor module 100. The region shown in FIG. 9 corresponds to the region shown in FIG. 3.

This embodiment is different from the first embodiment in wires 30*i*, 30*j*. The configuration other than the wires 30*i*, 30*j* is the same as that of the first embodiment. Thus, detailed description of the rest of the configuration is omitted.

As shown in FIG. 9, the wires 30*c*, 30*i* connect the connection member 50*a*1 to the circuit pattern Pr1. The wires 30*e*, 30*j* connect the connection member 50*a*2 to the circuit pattern Pr2. The current flows from the circuit pattern Pr1 to the connection member 50*a*1 through the wires 30*c*, 30*i*, and flows from the circuit pattern Pr2 to the connection member 50*a*2 through the wires 30*e*, 30*j*.

In the example shown in FIG. 9, one end of the wire 30*c* is connected to the upper surface (50*c*1) of the connection member 50a1. The other end of the wire 30c is connected to the circuit pattern Pr1 (P2, P3). One end of the wire 30i is connected to the upper surface (50c1) of the connection member 50a1. The other end of the wire 30i is connected to the circuit pattern Pr1 (P1, P2). One end of the wire 30e is connected to the upper surface of the connection member 50a2. The other end of the wire 30e is connected to the circuit pattern Pr2 (P4, P5). One end of the wire 30j is connected to the upper surface of the connection member 50a2. The other end of the wire 30j is connected to the circuit pattern Pr2 (P5, P6).

Providing the wires 30c, 30i on the semiconductor module 100 allows the current to flow from the circuit pattern Pr1 to the connection member 50a1 more easily than in the case of providing the wire 30c. Providing the wires 30e, 30j on the semiconductor module 100 allows the current to flow from the circuit pattern Pr2 to the connection member 50a2 more easily than in the case of providing the wire 30e.

The effect of this embodiment other than the foregoing is similar to that of the above first embodiment.

Third Embodiment

Figure 10A:
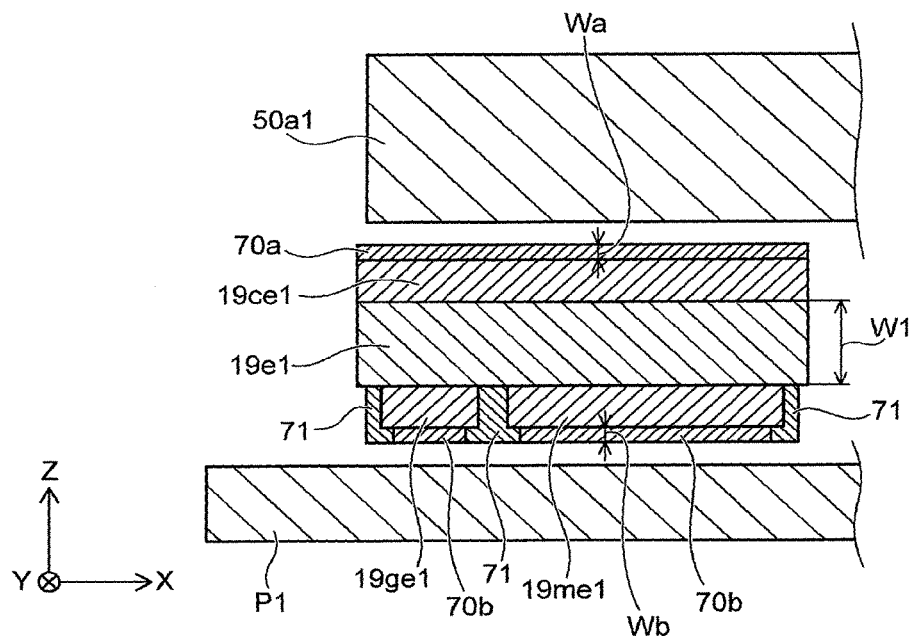
FIGS. 10A and 10B are sectional views showing a part of a semiconductor module according to a third embodiment.
Figure 10B:
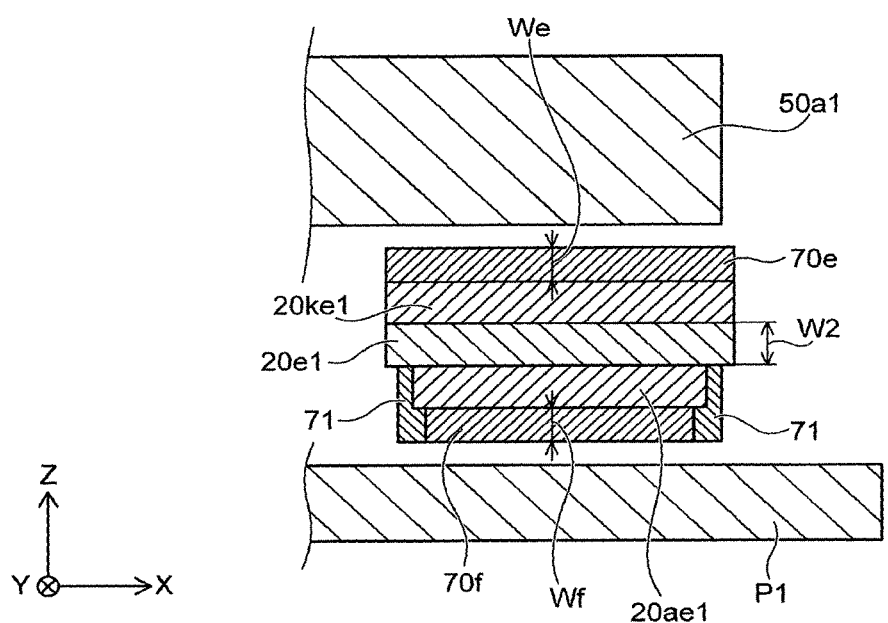

FIGS. 10A and 10B are sectional views showing part of a semiconductor module according to a third embodiment.

FIGS. 10A and 10B show a switching device 19A1 and a diode 20A1 in the semiconductor module 200, respectively. The regions shown in FIGS. 10A and 10B correspond to the regions shown in FIGS. 5A and 5B, respectively.

This embodiment is different from the first embodiment in solder layers 70e, 70f. The configuration other than the solder layers 70e, 70f is the same as that of the first embodiment. Thus, detailed description of the rest of the configuration is omitted.

As shown in FIGS. 10A and 10B, the Z-direction thickness W1 of the element part 19e1 of the switching device 19A1 is larger than the Z-direction thickness W2 of the element part 20e1 of the diode 20A1. In this case, the thickness We of the solder layer 70e and the thickness Wf of the solder layer 70f are made larger than the thickness Wa of the solder layer 70a and the thickness Wb of the solder layer 70b. Thus, the switching device 19A1 and the diode 20A1 can be formed between the connection member 50a1 and the circuit pattern P1 even when the thickness of the switching device 19A1 is different from the thickness of the diode 20A1.

When the thickness W2 is larger than the thickness W1, the thickness Wa of the solder layer 70a and the thickness Wb of the solder layer 70b are made larger than the thickness We of the solder layer 70e and the thickness Wf of the solder layer 70f.

That is, the thickness of the switching device 19A1 may be different from the thickness of the diode 20A1 depending on the thickness of the constituents (element part 19e1, upper surface electrode 19ce1, lower surface electrode 19me1, control electrode 19ge1) of the switching device 19A1 and the thickness of the constituents (element part 20e1, upper surface electrode 20ke1, lower surface electrode 20ae1) of the diode 20A1. Even in such a case, the switching device 19A1 and the diode 20A1 can be formed between the connection member 50a1 and the circuit pattern P1 by adjusting the thickness of the solder layers 70a, 70b, 70e, 70f.

The effect of this embodiment other than the foregoing is similar to that of the above first embodiment.

Fourth Embodiment

Figure 11:
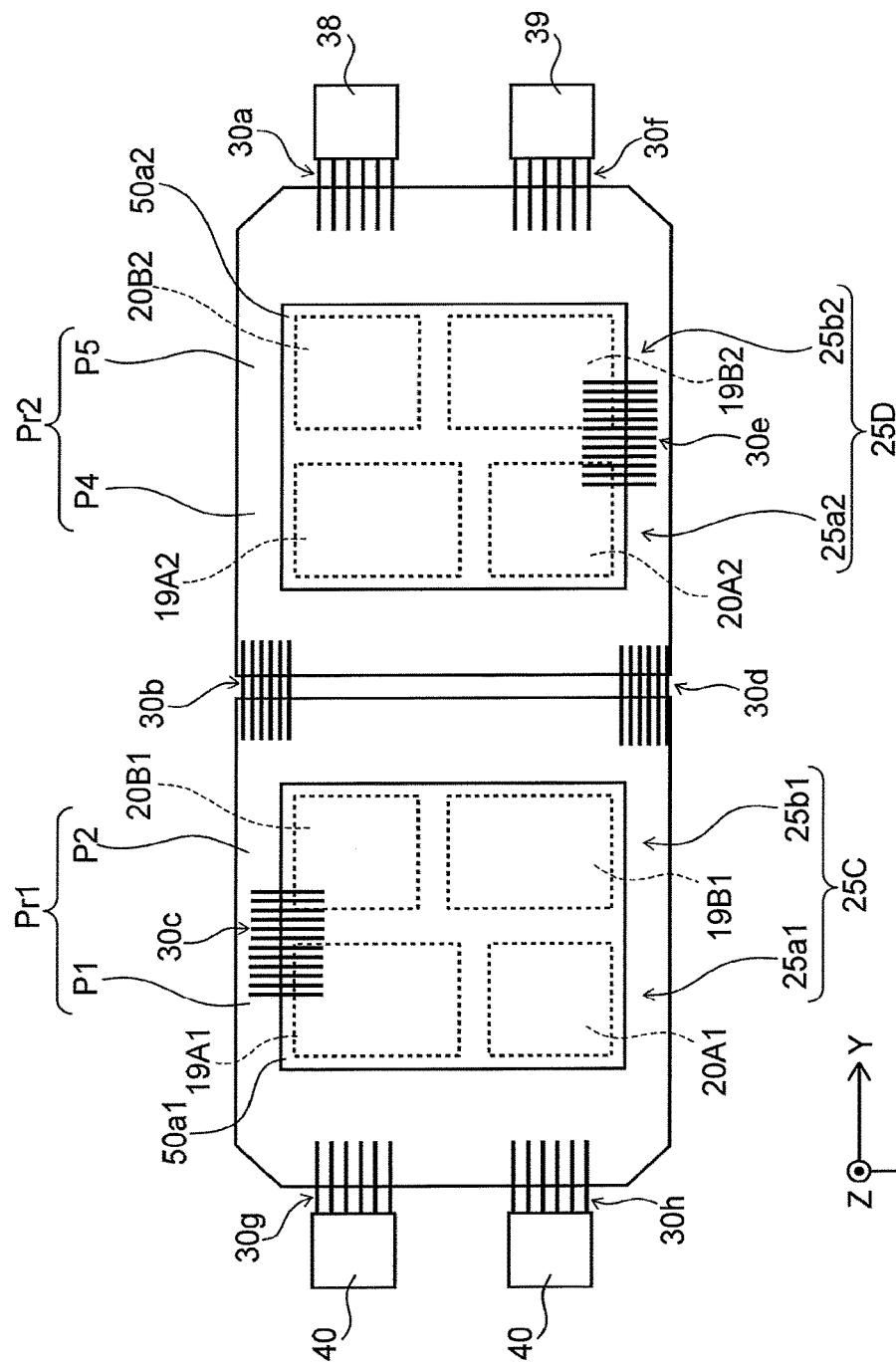
FIG. 11 is a plan view showing a semiconductor module according to a fourth embodiment.

FIG. 11 is a plan view showing a semiconductor module according to a fourth embodiment.

FIG. 11 shows the XY plane of the mounting substrate 25 and the connection member 50 in the semiconductor module 300. The region shown in FIG. 11 corresponds to the region shown in FIG. 3.

As shown in FIG. 11, two mounting components 25a1, 25b1 constitute a mounting substrate 25C. Two mounting components 25a2, 25b2 constitute a mounting substrate 25D.

In the mounting component 25a1, the switching device 19A1 and the diode 20A1 are mounted on the circuit pattern P1. In the mounting component 25b1, the switching device 19B1 and the diode 20B1 are mounted on the circuit pattern P2. The connection member 50a1 is provided on the switching devices 19A1, 19B1 and the diodes 20A1, 20B1.

In the mounting component 25a2, the switching device 19A2 and the diode 20A2 are mounted on the circuit pattern P4. In the mounting component 25b2, the switching device 19B2 and the diode 20B2 are mounted on the circuit pattern P5. The connection member 50a2 is provided on the switching devices 19A2, 19B2 and the diodes 20A2, 20B2.

The semiconductor module 300 is provided with wires 30a-30f. Circuit patterns Pr1, Pr2 are provided on the substrate 15. The circuit pattern Pr1 includes the circuit patterns P1, P2 in the mounting components 25a1, 25b1. The circuit pattern Pr2 includes the circuit patterns P4, P5 in the mounting components 25a2, 25b2.

The wire 30a connects the positive terminal 38 to the circuit pattern Pr2.

The wires 30b, 30d connect the circuit pattern Pr1 to the circuit pattern Pr2.

The wire 30c connects the connection member 50a1 to the circuit pattern Pr1.

The wire 30e connects the connection member 50a2 to the circuit pattern Pr2.

The wire 30f connects the negative terminal 39 to the circuit pattern Pr2.

Connection of the wires 30a-30f allows a current to flow in the semiconductor module 300.

The effect of this embodiment is similar to that of the above first embodiment.

Fifth Embodiment

Figure 12:
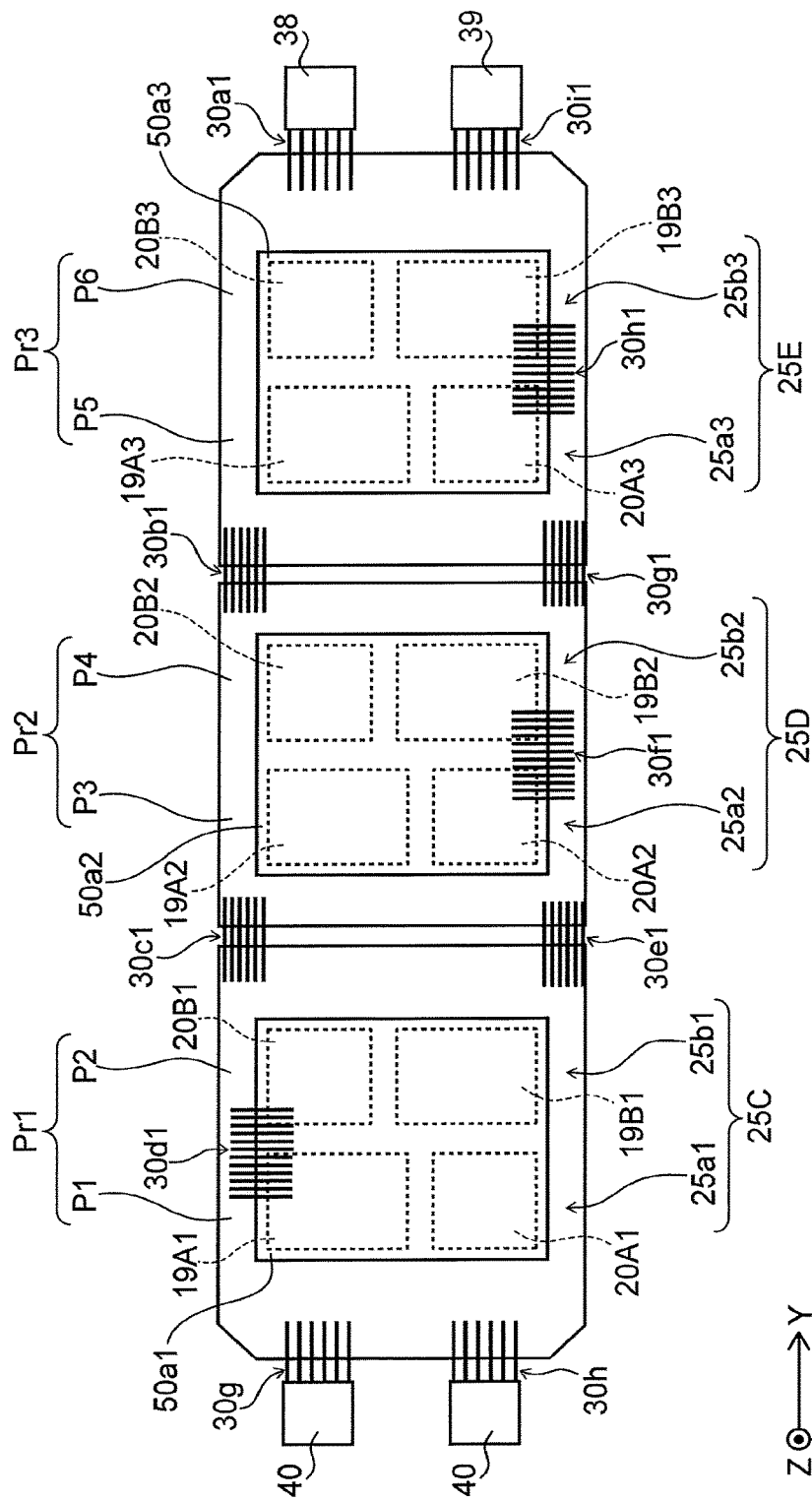
FIG. 12 is a plan view showing a semiconductor module according to a fifth embodiment.

FIG. 12 is a plan view showing a semiconductor module according to a fifth embodiment.

FIG. 12 shows the XY plane of the mounting substrate 25 and the connection member 50 in the semiconductor module 400. The region shown in FIG. 12 corresponds to the region shown in FIG. 3.

As shown in FIG. 12, two mounting components 25a1, 25b1 constitute a mounting substrate 25C. Two mounting components 25a2, 25b2 constitute a mounting substrate 25D. Two mounting components 25a3, 25b3 constitute a mounting substrate 25E.

In the mounting component 25a1, the switching device 19A1 and the diode 20A1 are mounted on the circuit pattern P1. In the mounting component 25b1, the switching device 19B1 and the diode 20B1 are mounted on the circuit pattern P2. The connection member 50a1 is provided on the switching devices 19A1, 19B1 and the diodes 20A1, 20B1.

In the mounting component 25a2, the switching device 19A2 and the diode 20A2 are mounted on the circuit pattern P3. In the mounting component 25b2, the switching device 19B2 and the diode 20B2 are mounted on the circuit pattern P4. The connection member 50a2 is provided on the switching devices 19A2, 19B2 and the diodes 20A2, 20B2.

In the mounting component 25a3, the switching device 19A3 and the diode 20A3 are mounted on the circuit pattern P5. In the mounting component 25b3, the switching device 19B3 and the diode 20B3 are mounted on the circuit pattern P6. The connection member 50a3 is provided on the switching devices 19A3, 19B3 and the diodes 20A3, 20B3.

The semiconductor module 400 is provided with wires 30a1-30i1. Circuit patterns Pr1, Pr2, Pr3 are provided on the substrate 15. The circuit pattern Pr1 includes the circuit patterns P1, P2 in the mounting components 25a1, 25b1. The circuit pattern Pr2 includes the circuit patterns P3, P4 in the mounting components 25a2, 25b2. The circuit pattern Pr3 includes the circuit patterns P5, P6 in the mounting components 25a3, 25b3.

The wire 30a1 connects the positive terminal 38 to the circuit pattern Pr3.

The wires 30b1, 30g1 connect the circuit pattern Pr2 to the circuit pattern Pr3.

The wires 30c1, 30e1 connect the circuit pattern Pr1 to the circuit pattern Pr2.

The wire 30d1 connects the connection member 50a1 to the circuit pattern Pr1.

The wire 30f1 connects the connection member 50a2 to the circuit pattern Pr2.

The wire 30h1 connects the connection member 50a3 to the circuit pattern Pr3.

The wire 30i1 connects the negative terminal 39 to the circuit pattern Pr3.

Connection of the wires 30a1-30i1 allows a current to flow in the semiconductor module 400.

The effect of this embodiment is similar to that of the above first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor module comprising:
a first circuit component including:
an insulating first substrate;
a first conductive layer provided on the first substrate;
a first switching device provided on the first conductive layer and including a first element part, a first electrode provided on an upper surface of the first element part, and a second electrode and a third electrode provided on a lower surface of the first element part; and
a first diode provided on the first conductive layer, spaced from the first switching device in a first direction parallel to an upper surface of the first substrate, and including a second element part, a fourth electrode provided on an upper surface of the second element part, and a fifth electrode provided on a lower surface of the second element part;
a conductive first connection member provided on the first electrode and the fourth electrode; and
a first wire connecting the first conductive layer and the first connection member.

2. The module according to claim 1, further comprising:
a plurality of first solder layers provided between the first electrode and the fourth electrode on one hand and the first connection member on the other, and between the second electrode, the third electrode, and the fifth electrode on one hand and the first conductive layer on the other.

3. The module according to claim 2, wherein
a thickness of the first solder layer provided between the first electrode and the first connection member is different from a thickness of the first solder layer provided between the fourth electrode and the first connection member, and
a thickness of the first solder layer provided between the second electrode and the third electrode on one hand and the first conductive layer on the other is different from a thickness of the first solder layer provided between the fifth electrode and the first conductive layer.

4. The module according to claim 1, further comprising:
a second circuit component spaced from the first circuit component in a second direction being parallel to the upper surface of the first substrate and crossing the first direction, the second circuit component including:
an insulating second substrate;
a second conductive layer provided on the second substrate;
a second switching device provided on the second conductive layer and including a third element part, a sixth electrode provided on an upper surface of the third element part, and a seventh electrode and an eighth electrode provided on a lower surface of the third element part; and
a second diode provided on the second conductive layer, spaced from the second switching device in the first direction, and including a fourth element part, a ninth electrode provided on an upper surface of the fourth element part, and a tenth electrode provided on a lower surface of the fourth element part;
a conductive second connection member provided on the sixth electrode and the ninth electrode; and
a second wire connecting the second conductive layer and the second connection member.

5. The module according to claim 4, further comprising:
a plurality of second solder layers provided between the sixth electrode and the ninth electrode on one hand and the second connection member on the other, and between the seventh electrode, the eighth electrode, and the tenth electrode on one hand and the second conductive layer on the other.

6. The module according to claim 5, wherein
a thickness of the second solder layer provided between the sixth electrode and the second connection member is different from a thickness of the second solder layer provided between the ninth electrode and the second connection member, and
a thickness of the second solder layer provided between the seventh electrode and the eighth electrode on one hand and the second conductive layer on the other is different from a thickness of the second solder layer provided between the tenth electrode and the second conductive layer.

7. The module according to claim 4, further comprising:
a third wire connecting the first conductive layer and the second conductive layer.

8. The module according to claim 4, further comprising:
a plurality of terminals provided on one end of a region in which the first circuit component and the second circuit component are placed.

9. The module according to claim 4, wherein the first connection member and the second connection member include at least one of copper, aluminum, and nickel.

10. The module according to claim 4, wherein the first connection member and the second connection member are shaped like a rectangle as viewed in a third direction perpendicular to the upper surface of the first substrate.

11. The module according to claim 4, further comprising:
a third circuit component located between the first circuit component and the second circuit component in the second direction, the third circuit component including:
an insulating third substrate;
a third conductive layer provided on the third substrate;
a third switching device provided on the third conductive layer and including a fifth element part, an eleventh electrode provided on an upper surface of the fifth element part, and a twelfth electrode and a thirteenth electrode provided on a lower surface of the fifth element part; and
a third diode provided on the third conductive layer, spaced from the third switching device in the first direction, and including a sixth element part, a fourteenth electrode provided on an upper surface of the sixth element part, and a fifteenth electrode provided on a lower surface of the sixth element part;
a conductive third connection member provided on the eleventh electrode and the fourteenth electrode; and
a fourth wire connecting the third conductive layer and the third connection member.

12. The module according to claim 1, further comprising:
a fifth wire spaced from the first wire in a second direction crossing the first direction, the fifth wire connecting the first conductive layer and the first connection member.

13. The module according to claim 1, further comprising:
a plurality of protective layers provided on an end part of the second electrode, an end part of the third electrode, and an end part of the fifth electrode.

14. A semiconductor module comprising:
a plurality of first circuit components each including a first conductive layer, and a first switching device and a first diode provided on the first conductive layer;
a plurality of second circuit components each including a second conductive layer, and a second switching device and a second diode provided on the second conductive layer;
a conductive first connection member provided on the plurality of first circuit components;
a conductive second connection member provided on the plurality of second circuit components;
a plurality of terminals provided on one end of a region in which the plurality of first circuit component and the plurality of second circuit component are placed; and
a plurality of wires respectively connecting one of the first conductive layer and the second conductive layer with the plurality of terminals, the first conductive layer with the second conductive layer, the first conductive layer with the first connection member, and the second conductive layer with the second connection member,
the plurality of first switching devices each including a first electrode connected to the first connection member, and a plurality of second electrodes connected to the corresponding first conductive layer,
the plurality of first diodes each including a third electrode connected to the first connection member, and a fourth electrode connected to the corresponding first conductive layer,
the plurality of second switching devices each including a fifth electrode connected to the second connection member, and a plurality of sixth electrodes connected to the corresponding second conductive layer,
the plurality of second diodes each including a seventh electrode connected to the second connection member, and an eighth electrode connected to the corresponding second conductive layer, and
the first connection member, the second connection member, the plurality of first conductive layers, and the plurality of second conductive layers being connected to the electrodes via solder layers.

15. The module according to claim 14, wherein the solder layers include a plurality of first solder layers provided between the first electrode and the third electrode on one hand and the first connection member on the other, and between the plurality of second electrodes and the fourth electrode on one hand and the first conductive layer on the other.

16. The module according to claim 15, wherein
a thickness of the first solder layer provided between the first electrode and the first connection member is different from a thickness of the first solder layer provided between the third electrode and the first connection member, and
a thickness of the first solder layer provided between the plurality of second electrodes and the first conductive layer is different from a thickness of the first solder layer provided between the fourth electrode and the first conductive layer.

17. The module according to claim 14, wherein the solder layers include a plurality of second solder layers provided between the fifth electrode and the seventh electrode on one hand and the second connection member on the other, and between the plurality of sixth electrodes and the eighth electrode on one hand and the second conductive layer on the other.

18. The module according to claim 17, wherein
a thickness of the second solder layer provided between the fifth electrode and the second connection member is different from a thickness of the second solder layer provided between the seventh electrode and the second connection member, and
a thickness of the second solder layer provided between the plurality of sixth electrodes and the second conductive layer is different from a thickness of the second solder layer provided between the eighth electrode and the second conductive layer.

19. The module according to claim 14, wherein the first connection member and the second connection member include at least one of copper, aluminum, and nickel.

20. The module according to claim 14, wherein the first connection member and the second connection member are shaped like a rectangle as viewed in a third direction perpendicular to the upper surface of the first substrate.

* * * * *